United States Patent [19]

Aoki et al.

[11] Patent Number: 5,824,570
[45] Date of Patent: Oct. 20, 1998

[54] METHOD FOR DESIGNING A SEMICONDUCTOR INTEGRATED CIRCUIT

[75] Inventors: Sachiko Aoki, Yokohama; Chiharu Mizuno, Tokyo, both of Japan

[73] Assignee: Kabushiki Kaisha Toshiba, Kawasaki, Japan

[21] Appl. No.: 616,727

[22] Filed: Mar. 15, 1996

[30] Foreign Application Priority Data

Mar. 15, 1995 [JP] Japan .................................... 7-055883
Mar. 13, 1996 [JP] Japan .................................... 8-056487

[51] Int. Cl.⁶ .................................................... H01L 21/82
[52] U.S. Cl. ............................................ 438/128; 438/129
[58] Field of Search ........................................ 438/128–129

[56] References Cited

U.S. PATENT DOCUMENTS 4,786,613  11/1988  Gould et al. ............................ 438/129
5,348,902   9/1994  Shimada et al. ........................ 438/129
5,459,340  10/1995  Anderson et al. ...................... 257/203
5,563,801  10/1996  Lee et al. ................................ 364/491

Primary Examiner—Jey Tsai
Attorney, Agent, or Firm—Foley & Lardner

[57] ABSTRACT

A semiconductor integrated circuit capabling of reducing a chip area by facilitating optimization of a chip layout and a method for designing the same has been provided. For given gate level connection description, use cell information designating gates which should be designed by employing the cell patterns prepared in advance is generated. When the gate level connection description is developed into the transistor level, hybrid connection description including mixedly transistor level and gate level is then generated by employing the cell patterns relative to the gates which being designated by the use cell information and by developing gates which being not designated by the use cell information into transistor level. A layout is then designed based on the hybrid connection description including mixedly the transistor level and the gate level.

3 Claims, 20 Drawing Sheets

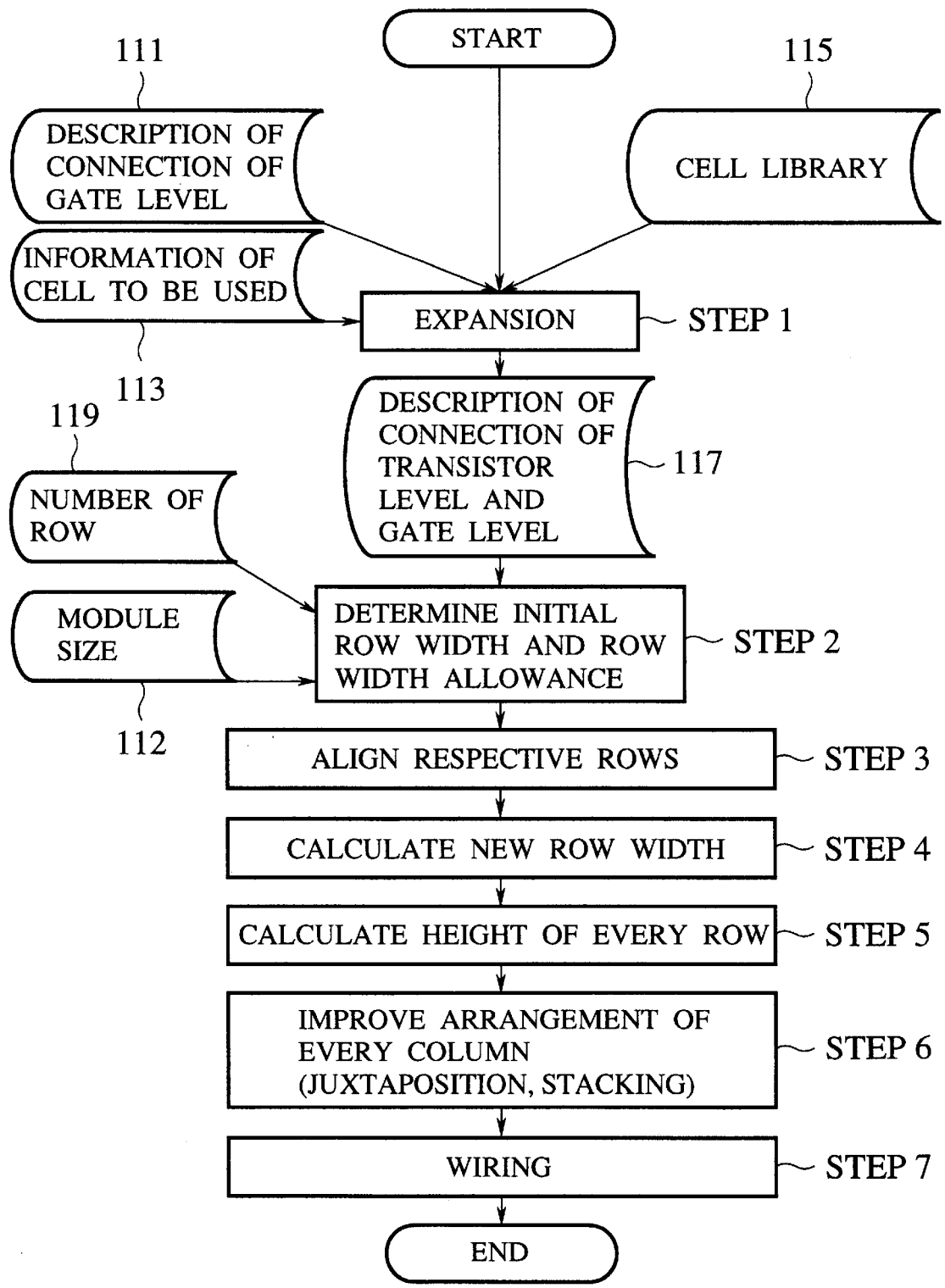

METHOD FOR DESIGNING A SEMICONDUCTOR INTEGRATED CIRCUIT

BACKGROUND OF THE INVENTION

1. Field of the Invention

The present invention relates to a semiconductor integrated circuit and a method for designing the same and, more particularly, a semiconductor integrated circuit capabling of reducing a chip area and reducing power consumption and a method for designing the same.

2. Description of the Related Art

As a semiconductor integrated circuit is fabricated on a larger scale, it becomes difficult to design manually an entire circuit, so that an automatic circuit design by virtue of the computer has been implemented popularly. As the conventional automatic design of the semiconductor integrated circuit, there have been a gate array scheme and a standard cell scheme for designing a layout of all gates by employing cells prepared in advance, a scheme for designing a layout of all gates at a transistor level by developing them, a scheme for designing a layout of cells by first executing the layout by virtue of the standard cell scheme and then executing the layout again by replacing them with other cells being prepared beforehand, and so on. For purposes of an example, in the standard cell scheme shown in FIG. 1, optimally designed standard cells 1601 are registered in a cell library preliminarily, and upon designing the circuit a layout of the standard cells 1601 and wirings 1603 is designed by virtue of the computer by combining a variety of standard cells 1601 registered in the cell library with each other so as to reduce lengths of the wirings 1603 connecting respective standard cells 1601. As a result, an optimal circuit design be able to be implemented.

In the meanwhile, according to the conventional automatic design in a transistor level, the layout must be designed as it is even in the case where the transistors having different sizes must be designed. For this reason, transistor widths become uneven thus creating dead spaces in the circuit. As a countermeasure against this problem, the inventors of this patent application have proposed a method for overcoming the problem in the Japanese patent application No.7-55876. However, this method can be applied only to such circuits that are formed of transistors alone. To overcome this problem of such unevenness, it can be considered as another countermeasure to employ transistors which are deformed to make all of uniform height. But in this event dead spaces occur due to mismatching between transistor rows since the widths of the transistor rows are varied.

Among the wirings, there are power supply wirings which have a broad wires width rather than common signal lines and therefore affect considerably area of wiring regions in the chip. As an example of conventional schemes for laying the power supply wirings, there is shown an instance of hierarchy layout design schemes in FIG. 2. In the hierarchy layout design schemes, in general the chip comprises blocks composed of a plurality of logical circuit elements and already designed blocks which being optimally designed beforehand. In FIG. 2, one block has been observed which is formed by element rows 1703 composed of a plurality of logical circuit elements. At first, by estimating empirically a quantity of the current required for operating the logical circuit elements in the block, line widths of power supply wirings 1707 sufficient to supply quantity of the current may be determined. The power supply wirings 1707 are so arranged that power supply elements 1719 formed on the chip peripheral portion and power-supply wire dedicated elements 1717 aligned in the element rows 1703 are connected electrically. Usually the power-supply wire dedicated elements 1717 are arranged on both sides of respective element rows 1703, but if the case where the element rows 1703 are prolonged and so on is considered, auxiliary power-supply wire dedicated elements 1717 are also arranged in the middle of the element rows 1703. Although not shown in the figure, additional auxiliary power-supply line dedicated elements 1717 may be arranged also in other locations if necessary.

However, in the design method of the semiconductor integrated circuit by virtue of conventional automatic design and in the semiconductor integrated circuit formed by the conventional power supply wiring laying scheme, various problems have arisen respectively as discussed hereinbelow. Such problems will be discussed item by item as follows.

(1) Problems in the design method of the semiconductor integrated circuit by virtue of conventional automatic design:

For the reasons discussed hereinbelow, optimization of the layout has not been realized easily in the conventional automatic design for the semiconductor integrated circuit.

In the gate array scheme and the standard cell scheme, if the layout pattern once obtained does not meet the requirements, large-scaled variations such as net variation, relayout, etc. are needed to correct the layout pattern. In addition, since available cells are limited to those prepared previously in the cell library, it is difficult for the scheme to generate the layout pattern which can satisfy the required specifications perfectly. Furthermore, in order to reduce power consumption in the circuit, no countermeasure can be taken other than modification of cells and nets. This entails much time and labor.

In the scheme wherein the layout may be designed by developing all gates into transistor level, even in the case of the circuit such as flip-flop to which a severe timing constraint is imposed, constituting transistors of the circuit are not always arranged adjacently. Hence, unless the transistors have been arranged adjacently to each other, the case will be caused where the timing required can no longer be satisfied resulting in malfunctional operation. Since power consumption be able to be reduced by modifying the size of the transistors in the scheme, pattern relayout may be completed by less modification rather than those in the gate array scheme and the standard cell scheme. Conversely, a possibility may occur that partially the size of the transistors has been increased extremely.

In addition, there is a layout scheme of cells in which first the layout of cells is designed by means of the standard cell scheme and then a relayout of cells is designed by replacing some cells with other cells being prepared beforehand if it has been found by later verification that some cells do not satisfy the specifications such as an operation speed. In such layout scheme, much time and labor are also needed since the layout must be designed more than two times.

(2) Problems in the conventional automatic design in a transistor level:

It seems that the most effective layout can be achieved by the transistor level layout scheme since arrangements of the transistors may be freely set in such layout scheme. However, in the event that the transistors have their different sizes, widths of the transistors become uneven inevitably. Such unevenness usually creates dead spaces to thus decrease utilization factor of the chip area. To solve such unevenness problem, it may be considered to make heights of the transistors uniform beforehand. But in this event dead spaces are generated by the unevenness of the transistor rows because of change in the widths of the transistor rows. Therefore, dead spaces are inevitable to some extent in the prior art.

(3) Problems in the semiconductor integrated circuit formed by the conventional power supply wiring laying scheme:

In the conventional power supply wiring laying scheme by virtue of the hierarchy layout design scheme, it has been difficult to arrange the power supply wirings without their bending portions. Power has been supplied to the blocks formed of the logical circuit elements only via the power-supply wire dedicated elements which are arranged on both ends of the element rows and inserted into some intermediate positions thereof. Thus, in the event that power supply wirings should be connected between the power supply elements provided in the peripheral portion of the chip and the power-supply line dedicated elements provided in the logical circuit element block so as not to intersect with other power supply wirings and common signal wirings, there is no way except that the power supply wirings have to be arranged with their bending portions. Hence, a wiring length of the power supply wiring which has a broader line width than those of the common signal wirings would be extended every time when the bending portion of the power supply wirings is formed, so that an occupied area of the power supply wirings is enhanced. Furthermore, if the power supply wirings are formed as a multi-layered wiring structure, via holes (referred to simply as "VIAs" hereinafter) must be formed on respective bending portions to contact the wirings to each other. Since size of the VIAs needs margin of process, the VIA has to be formed usually to have a larger size than the line width of the wiring. Therefore, an occupied area of the VIA is not negligible. There has been caused the problem that areas of the wiring regions are increased every time when the power supply wirings are bent, and as a result the chip area is increased.

SUMMARY OF THE INVENTION

The present invention has been made in light of the above circumstances, and it is an object of the present invention to provide a semiconductor integrated circuit capabling of reducing the chip area and reducing power consumption by facilitating optimization of the chip layout and a method for designing the same.

It is another object of the present invention to provide a semiconductor integrated circuit capabling of implementing gates of the smallest size, optimization design of which cannot be achieved in a transistor level, and a method for designing the same.

It is still another object of the present invention to provide a semiconductor integrated circuit capabling of reducing wiring impedance and reducing power supply noise and a method for designing the same.

It is a yet still another object of the present invention to provide a semiconductor integrated circuit capabling of designing a desired pattern with the smallest area even if cells and transistors have different sizes and rows in initial arrangement have different widths and a method for designing the same.

In order to achieve the foregoing objects, according to an aspect of the present invention, there is provided a method for designing a semiconductor integrated circuit, comprising the steps of generating gate level connection description, replacing part of gates being described by said gate level connection description with cells in a cell library being prepared in advance, developing remaining of said gates being described by said gate level connection description into constituting transistors, and designing a layout by virtue of said constituting transistors and said cells.

According to another aspect of the present invention, there is provided a method for designing a semiconductor integrated circuit, comprising the steps of setting a cell reference position used as a reference upon designing a layout, designing cell patterns to be prepared in advance with reference to said cell reference position; generating use cell information to designate gates to which said cell patterns should be employed, relative to assigned gate level connection description, generating hybrid connection description including mixedly transistor level and gate level by employing said cell patterns for said gates being designated by said use cell information and by developing gates being not designated by said use cell information into transistor level when said gate level connection description is developed into a transistor level, and designing a layout with reference to said cell reference position based on said hybrid connection description including mixedly said transistor level and said gate level.

According to still another aspect of the present invention, there is provided a semiconductor integrated circuit, comprising ring power supply wirings arranged so as to surround a block consisting of logical circuit elements, wirings for connecting said block with said ring power supply wirings, and wirings for connecting said ring power supply wirings with power supply elements.

According to yet still another aspect of the present invention, there is provided a semiconductor integrated circuit having a plurality of blocks consisting of logical circuit elements, comprising power supply elements for providing power supply to said logical circuit elements, means for setting arbitrarily voltage of said power supply supplied from said power supply elements, and power supply wirings including ring power supply wirings arranged to surround said blocks, wirings connecting said blocks with said ring power supply wirings, and wirings connecting said ring power wirings with said power supply elements, wherein voltages being supplied to respective blocks may be established independently.

In the preferred embodiment of the present invention, said ring power supply wirings are formed of an at least two-layered wiring layer.

According to further aspect of the present invention, there is provided a method for automatically designing a CMOS pattern in which transistors and cells are mixedly arranged in P-well regions and N-well regions both being adjacent to each other to put well isolation regions therebetween, comprising the steps of arranging adjacently plural pairs of P-channel transistors and N-channel transistors which being formed respectively adjacent to each other to put well isolation regions therebetween and cells which being selected from a cell library to coincide their regions with each other, decomposing transistors into plural pairs of transistors each having a narrower width than that of said transistors by parallelizing a pair of said transistors, and reducing heights of said P-well regions and said N-well regions.

In the preferred embodiment of the present invention, said heights of said P-well regions and said N-well regions are reduced up to a maximum value of heights of said cells.

According to still further aspect of the present invention, there is provided a method for automatically designing a CMOS pattern in which transistors and cells are mixedly arranged in P-well regions and N-well regions both being formed adjacent to each other to put well isolation regions therebetween, comprising the steps of arranging adjacently plural pairs of P-channel transistors and N-channel transistors which being formed respectively adjacent to each other to put well isolation regions therebetween and cells which being selected from a cell library to coincide their regions with each other, and reducing widths of said P-well regions and said N-well regions in which said transistors and said cells are arranged, by stacking plural pairs of said transistors on both sides of said cells.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 9 is a flowchart illustrating process according to a fourth embodiment of the present invention;

DETAILED DESCRIPTION OF THE PREFERRED EMBODIMENTS

There will now be described embodiments of the present invention with reference to the accompanying drawings hereinafter.

First Embodiment

A first embodiment of the present invention will be explained with reference to FIG. 3 hereinbelow.

Figure 3:
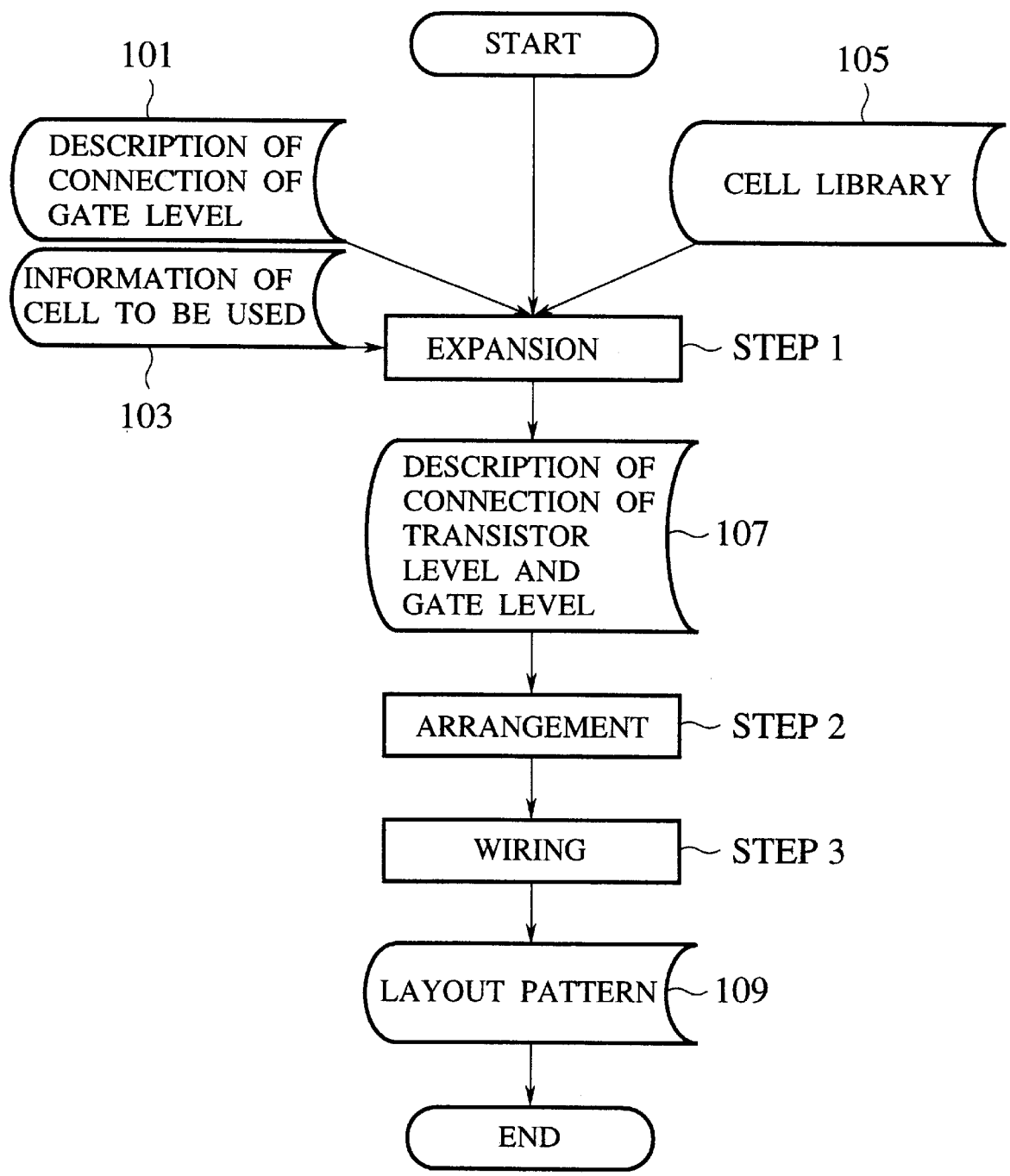
FIG. 3 is a flowchart illustrating process according to a first embodiment of the present invention.

FIG. 3 is a flowchart illustrating process according to the first embodiment of the present invention. First process in the first embodiment will be explained in brief along steps in FIG. 3. It would be assumed that up to cell pattern design designated by use cell information has been completed prior to this process.

In FIG. 3, gate level connection description 101 of a module (layout unit) is developed into hybrid connection description 107 including mixedly the transistor level and the gate level. In this expanding process, with respect to the given gate level connection description 101, gates which being designated by use cell information 103 are not developed into the transistor level, then cell patterns which being prepared in a cell library 105 beforehand are employed. While gates which being not designated by use cell information 103 are developed into the transistor level (step 1).

Then, on the basis of the hybrid connection description 107 including mixedly the transistor level and the gate level, transistor and gate patterns are arranged (step 2).

Finally, wirings are provided between the transistor and gate patterns arranged as above, thus resulting in a desired layout pattern 109 (step 3).

Subsequently, processes in respective steps will be explained in more detail.

Process in step 1 will be discussed at first with reference to FIGS. 3 to 5.

The gates which being not developed into the transistor level and to which cell patterns preliminarily prepared in the cell library 105 must be employed may be selected from the described gates. Use cell information 103 designating the gates may then be generated.

The followings are the gates, for instance, to which the cell patterns prepared in the cell library 105 must be employed.

(1) Gates such as NAND circuits and NOR circuit having relatively high frequency in use.

This is because the layout relative to these gates has been matured, and therefore in numerous cases greater work efficiency may be attained by employing existing layouts rather than developing the gates into the transistor level. Indeed if the gates having relatively high frequency in use have been minimized, entire layout may be optimized further more.

(2) Gates and partial circuits such as flip-flop, latch circuit, etc. to which severe requirements for performance are imposed.

This is because, if the layout for these circuits is designed by virtue of the automatic design after developing them into the transistor level, performances required for these circuits cannot be satisfied. Accordingly, manual design would be suitable for these circuits.

(3) Other circuits reluctant to the automatic design.

For particular gates and partial circuits of some kind, there are cases where optimal results cannot be achieved by virtue of the automatic design. Some of them are due to their own nature of the circuits, and others have been found empirically.

Optimization design of these gates is infeasible since, if layout of these gates is designed at the transistor level, various drawbacks would be caused, e.g., partially size of the transistor must be expanded extremely to meet the requirements for performance.

In the cell library 105, a variety of cell patterns which are optimally designed at the gate level beforehand are registered. The cell library 105 may be utilized as a common cell library upon designing layout of respective modules. Cell patterns to be registered in advance must be prepared not for all gates, but for only gates and partial circuits which are not to be developed into the transistor level in step 1.

Figure 4:
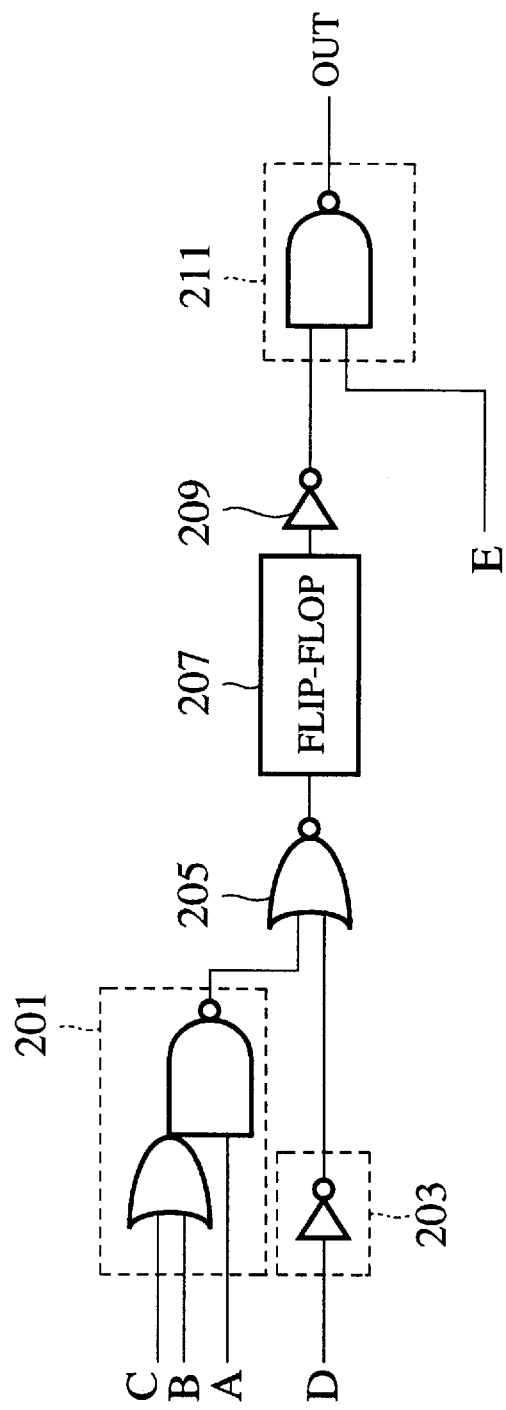
FIG. 4 is a circuit diagram showing an example of gate level connection description of a semiconductor integrated circuit a layout of which being designed according to process illustrated in the flowchart in FIG. 3.

FIG. 4 is a circuit diagram showing an example of gate level connection description 101 of the module designed according to the flowchart shown in FIG. 3. In FIG. 4, NOR gate 205, flip-flop 207, and inverter 209 correspond to the gates described by the use cell information 103. The gates are still at the gate level as it is instead of developing them into the transistor level, while other gates 201, 203, 211 are developed into the transistor level.

Figure 5:
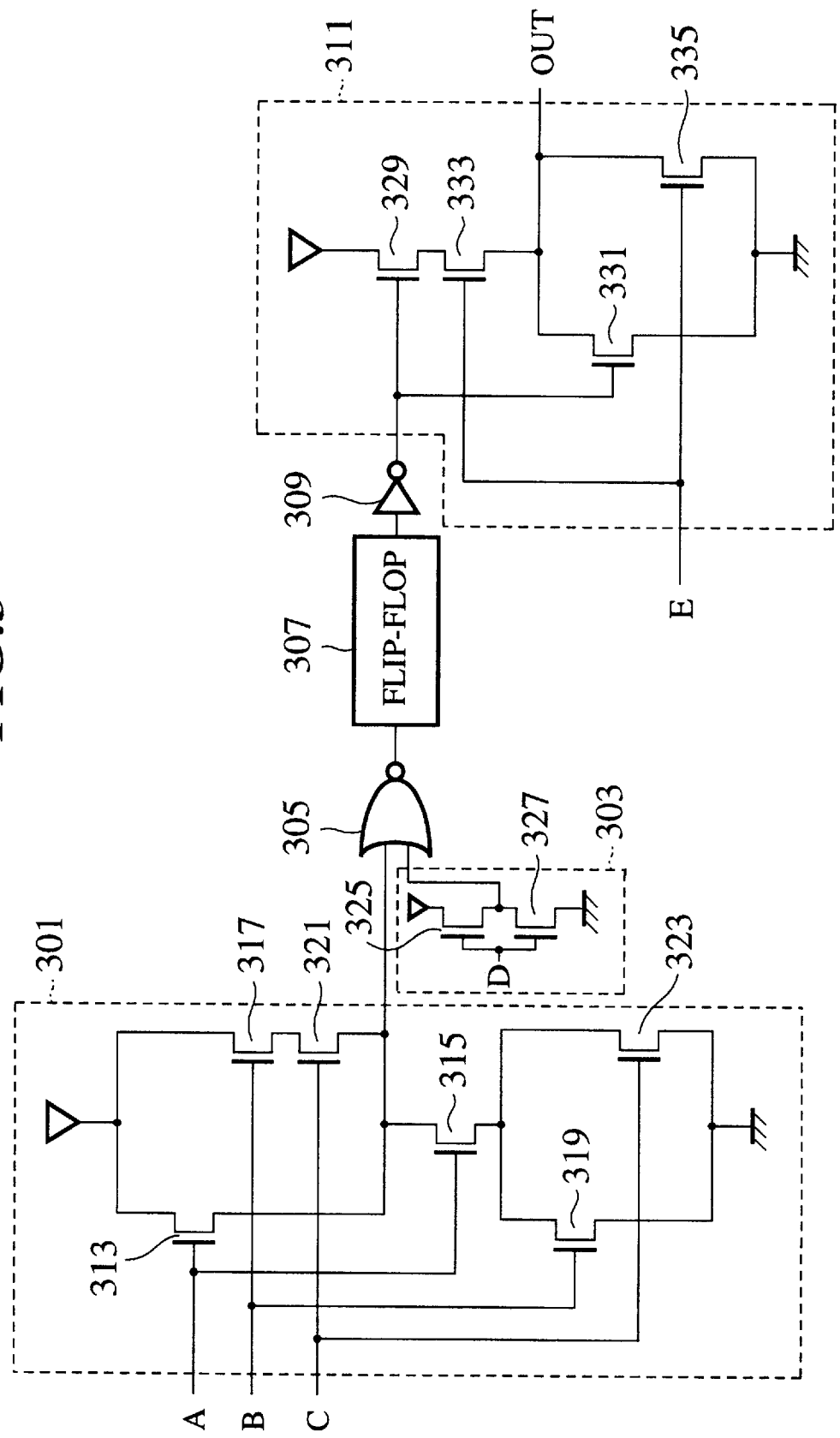
FIG. 5 is a circuit diagram showing an example of hybrid connection description of a semiconductor integrated circuit at a transistor level and a gate level, which being developed in step 1 in FIG. 3.

FIG. 5 is a circuit diagram showing an embodiment wherein the gate level connection description shown in FIG. 4 is processed by the developing process in step 1 of the flowchart in FIG. 3.

Referring to FIG. 5, NOR gate 305, flip-flop 307, and inverter 309 are the gate level connection description of NOR gate 205, flip-flop 207, and inverter 209 shown in FIG. 4 which are not developed in step 1 in FIG. 3. Transistor level connection description 301, 303, 311 are gates 201, 203, 211 shown in FIG. 4 which are developed into the transistor level in step 1 in FIG. 3.

As discussed earlier, the gate level connection description 101 can be developed into hybrid connection description 107 including mixedly the transistor level and the gate level.

Figure 6:
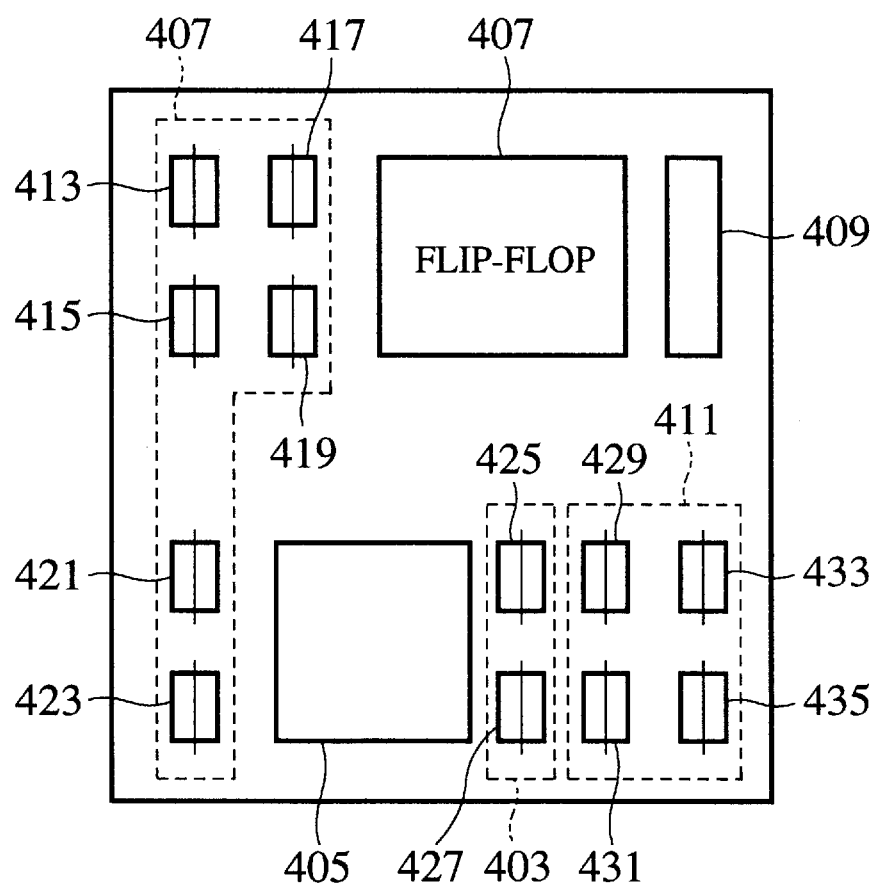
FIG. 6 is a schematic circuit diagram showing an example of the semiconductor integrated circuit a layout of which being designed according to process illustrated in the flowchart in FIG. 3.

Next, processes in steps 2 and 3 will be explained with reference to FIGS. 3, 5 and 6. FIG. 6 is a schematic circuit diagram showing an embodiment wherein the hybrid connection description 107 including mixedly the transistor level and the gate level shown in FIG. 5 is processed by the arranging process in step 2 of the flowchart in FIG. 3.

Referring to FIG. 6, gate patterns 405, 407, 409 are generated by arranging the gate patterns in the gate level connection descriptions 305, 307, 309 shown in FIG. 5 at the transistor level. Transistor patterns 401, 403, 411 are generated by arranging respective transistors 313 to 335 in the transistor level connection descriptions 301, 303, 311 shown in FIG. 5 at the transistor level.

Gate patterns 405, 407, 409 are designed by employing the cell patterns being prepared in the cell library 105 and then arranging them. Transistor patterns 401, 403, 411 are designed by arranging the transistors 313 to 335 as a pair of N-channel and P-channel transistors, respectively. For instance, the transistors 313 and 315 shown in FIG. 5 are arranged as a pair like transistors 413 and 415 shown in FIG. 6. Usually the gate patterns 405, 407, 409 and the transistors 313 to 335 are arranged to be aligned in a row.

Since the transistor patterns 401, 403, 411 are arranged at the transistor level, layout can be generated in optimum transistor size. Since the cell patterns which being prepared beforehand may be employed with respect to the gate patterns 405, 407, and 409, gates such as flip-flop to which a severe timing constraint is imposed may be implemented in the smallest size. After the arrangement being completed, necessary wirings are provided between respective transistors 413 to 435 and respective gate patterns 405, 407, 409.

With the foregoing process, by designing the layout by mixedly employing transistors and previously prepared cell patterns, power consumption can be reduced and the optimum layout pattern 109 can be derived.

Second Embodiment

Figure 7:
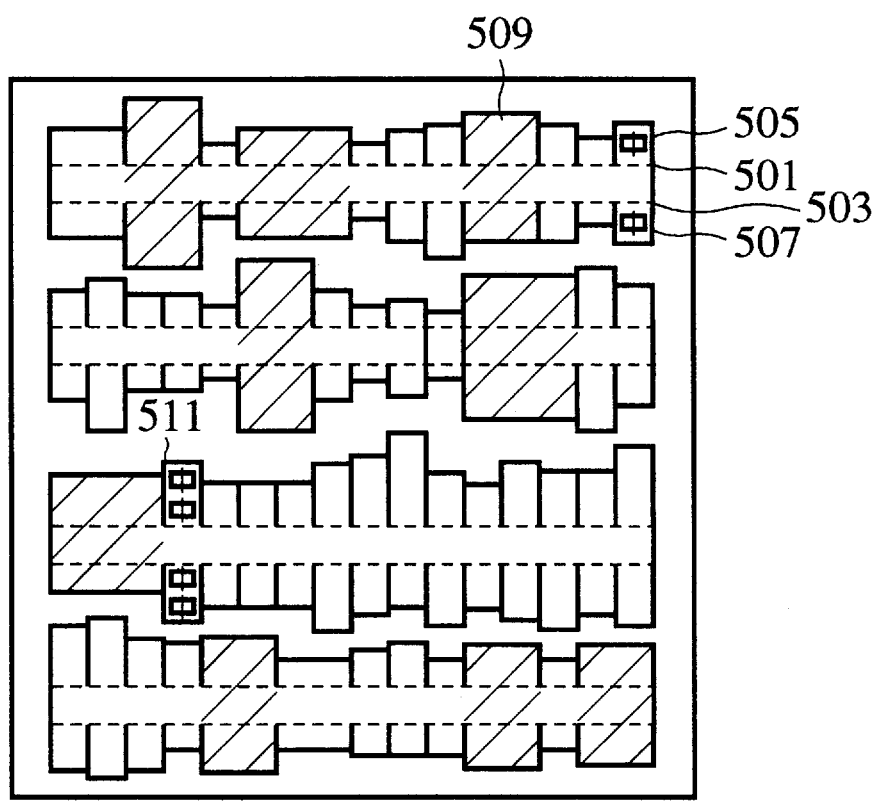
FIG. 7 is a schematic circuit diagram showing an example of a semiconductor integrated circuit a layout of which being designed according to a second embodiment of the present invention.

A second embodiment of the present invention will be explained with reference to FIGS. 3 and 7 hereinafter. FIG. 7 is a schematic diagram showing an embodiment wherein a layout is designed according to the second embodiment of the present invention.

In FIG. 7, a pair of cell reference positions 501, 503 are used as reference positions to arrange transistors. By way of example, the position 501 serves as a reference to arrange an N-channel transistor 505 and the position 503 serves as a reference to arrange a P-channel transistor 507. A distance between the reference position 501 to arrange the N-channel transistor 505 and the reference position 503 to arrange the P-channel transistor 507 coincides with a minimum distance between the N-channel transistor 505 and the P-channel transistor 507 on a design rule.

A cell pattern 509 prepared in the cell library 105 is optimally designed beforehand based on the cell reference positions 501, 503. The N-channel transistor and the P-channel transistor constituting the cell pattern 509 have been designed previously to coincide with the cell reference positions 501 and 503, respectively.

Under this circumstance, only if the cell patterns 509 and a pair of the transistors 505, 507 are arranged in accordance with the cell reference positions 501, 503 in the arranging process in step 2, the layout may easily arranged since it can meet the design rule. Therefore, if the cell reference positions 501, 503 are set as described above and the previously prepared cell patterns 509 are optimally designed to coincide with the cell reference positions 501 and 503, the cell patterns 509 can be readily arranged. Hence, such constraint can be removed that heights or widths must be formed uniformly in the cell pattern in the conventional standard cell scheme. In addition, by arranging the pair of the transistors 505, 507 in conformity with the cell reference positions 501, 503, the pair of the transistors 505, 507 of various sizes may be easily designed. Moreover, there is no necessity that the transistors have to be aligned if they are formed in a predetermined well, the transistors such as the transistor 511 may be piled up in a multilevel fashion in units larger than the pair so as to coincide with heights of the neighbor transistors and cell patterns.

As has stated above, the layout of the previously prepared cell patterns and the transistors may be facilitated.

Third Embodiment

Figure 8:
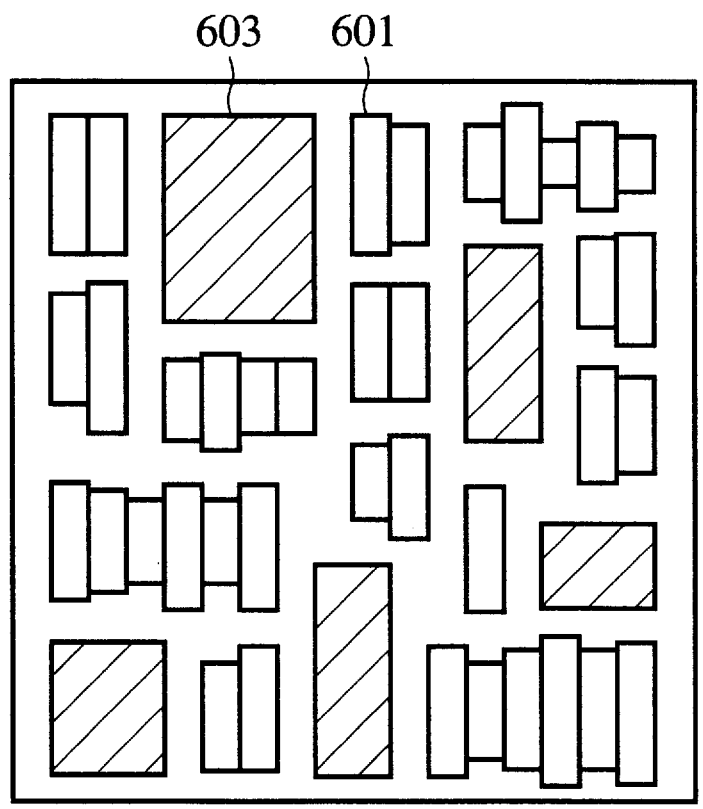
FIG. 8 is a schematic circuit diagram showing an example of a semiconductor integrated circuit a layout of which being designed according to a third embodiment of the present invention.

A third embodiment of the present invention will be explained with reference to FIGS. 3 and 8 hereinafter. FIG. 8 is a schematic diagram showing an embodiment wherein a layout is designed according to the third embodiment of the present invention.

If transistor pairs 601 and cell patterns 603 prepared in advance are treated respectively as a cell and a macrocell in a semicustom scheme, approaches in the conventional semicustom scheme may be utilized in the arranging process in step 2 in FIG. 3.

Fourth Embodiment

A fourth embodiment of the present invention will be explained with reference to FIGS. 9 and 10 hereinafter. Like the first embodiment, gate level connection description 111 of the module is developed into hybrid connection description 117 including mixedly the transistor level and the gate level. In this developing process, as for the given gate level connection description 111, gates designated by use cell information 113 are not developed into the transistor level and cell patterns previously prepared in a cell library 115 are employed. On the contrary, gates not designated by the use cell information 113 are developed into the transistor level (step 1).

Gates such as NAND, NOR having relatively high frequency in use, gates such as flip-flop to which a severe timing constraint is imposed, and the like in the gate level connection description are prepared beforehand in a cell library 112 as the patterns in which P-channel regions and N-channel regions are separated on the upper and lower sides. The example in FIG. 4 is also shown as the gate level connection description. Similarly, the example in FIG. 5 is also utilized as the hybrid connection description including mixedly the transistor level and the gate level generated by developing the example in FIG. 4. According to use cell information, flip-flop, NOR gate, and inverter are generated by previously prepared cells whereas other gates are developed.

In turn, in step 2, initial row widths and row width allowances may be calculated according to the given number of rows 119 and module sizes 121. As an example of the initial row width IRW, $$IRW = MW \quad (1)$$

if an input module width is assumed as MW. The row width allowance ARW is given by $$ARW = MW * \alpha/100, \quad (2)$$

where the initial row width is α%. According to the hybrid connection description including mixedly the transistor level and the gate level, the transistors and the cells may be arranged at the developing level in a range of the row width allowance, i.e., within a row width of IRW±ARW in respective row regions (step 3).

This process has been executed based on the method discussed in the second embodiment of the present invention. More particularly, in FIG. 10A, the N-channel transistor 505 formed in the N-well region and the P-channel transistor 507 formed in the P-well region are formed as a pair. A distance between the reference position 501 to arrange the N-channel transistor 505 and the reference position 503 to arrange the P-channel transistor 507, i.e., a well distance, coincides with a minimum distance between the N-channel transistor 505 and the P-channel transistor 507 on a design rule. Similarly, the cell pattern 509 may be optimally designed beforehand in conformity with the cell reference positions 501, 503.

At this time, if the length of the wirings can be shortened with considering connection relations in the nets, any approach may be applied such as MIN-CUT method wherein arrangement of the transistor pairs is determined by dividing transistor pair sets so as to minimize the number of cuts. However, in this embodiment, because transistor row widths will be adjusted in later process, the widths of respective rows are not always arranged uniformly if the transistor row widths are within the row width allowance. Hence, in spite of the constraint of uniform row width, arrangement may be effected relatively freely based on the consideration of connection to the nets.

Subsequently, module width, i.e., row width RW and row height RH may be decided in every row. The length of the row may be rendered longer than the original state by means of parallelization of transistor and rendered shorter by means of stacking process. The height of the row may be made lower than the original state by means of parallelization of transistor and made higher by means of stacking process.

First the case will be explained where the transistors are not stacked on the upper and lower portions of the cells. Assume that minTW is a minimum size of the transistor specified by a design rule; TL, channel length of transistor; DT, distance between transistors; NTr, larger number of P-channel transistor or N-channel transistor arranged in the r-th rows (r=1 to NR); TWri (i=1 to NTr), width of transistors; NCr, number of cells; CHri (i=1 to NCr), height of cells; and CWri (i=1 to NCr), width of cells, then a width RWr of the r-th row is given by $$RWr = \sum_{}^{NTr} I\{(TWri + RH - minTW)/RH\} * (TL + DT) + \sum_{}^{NCr} Cwri, \quad (3)$$

if the transistors are parallelized based on the height RH, where a function I(X) is integer portions of X. Under the condition of max(CHri)>RH, if the transistors are parallelized on the basis of the height RH, only the dead spaces are created but the height of the row is not changed. If $$CHr = max(CHri), \quad (4)$$

then the row width to eliminate the dead space will be given by $$RWr = \sum_{}^{NTr} I\{(TWri + CHr - minTW)/CHr\} * (TL + DT) + \sum_{}^{NCr} Cwri, \quad (5)$$

Figures 11A, 11B, 11C:
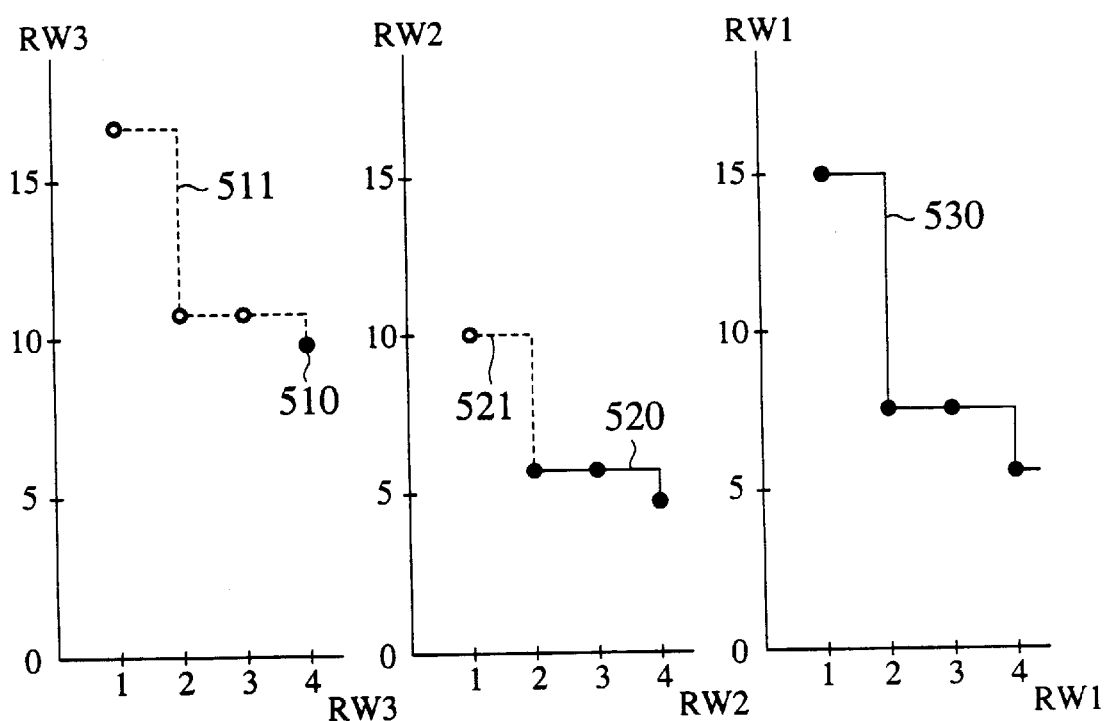
FIGS. 11A to 11C are graphs respectively showing a relation between widths and heights of transistor rows when parallelization of transistors are effected according to the fourth embodiment of the present invention.

When parallelization of the transistors is effected based on this equation (5), graphs may be derived as shown in FIG. 11, which illustrate relations between width and height of respective rows in accordance with size distributions of the transistors and the cells arranged in rows. In FIGS. 11A to 11C, 510, 520, 530 indicate relations between height and width of the rows when parallelization of the transistors is effected based on the height which creates no dead space between the cells, and 511, 521 indicate relations between height and width of the rows when parallelization of the transistors is effected based on the height which produces dead spaces between the cells.

In step 4, a new module width is determined according to the situations of respective arranged rows. The new module width is now set to be equal to the initial row width. In step 5, a row height RHr of every row r corresponding to width IRW is calculated.

In step 6, parallelization of the transistors is executed based on the width and height of the row calculated in steps 4 and 5.

Finally, wirings of the transistors or the cells arranged in 112 are provided. The wiring process can be implemented similarly to the wiring program in the automatic layout in the conventional semicustom scheme.

Figure 10A:
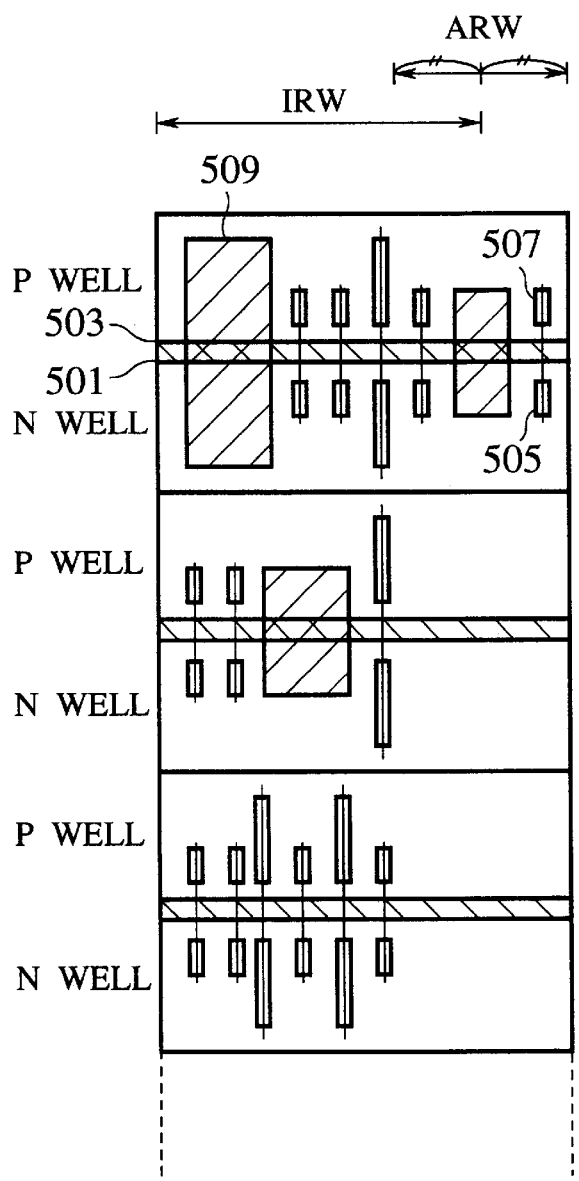
FIGS. 10A and 10B are schematic circuit diagrams showing an example of the semiconductor integrated circuit a layout of which being designed according to process illustrated in the flowchart in FIG. 9.
Figure 10B:
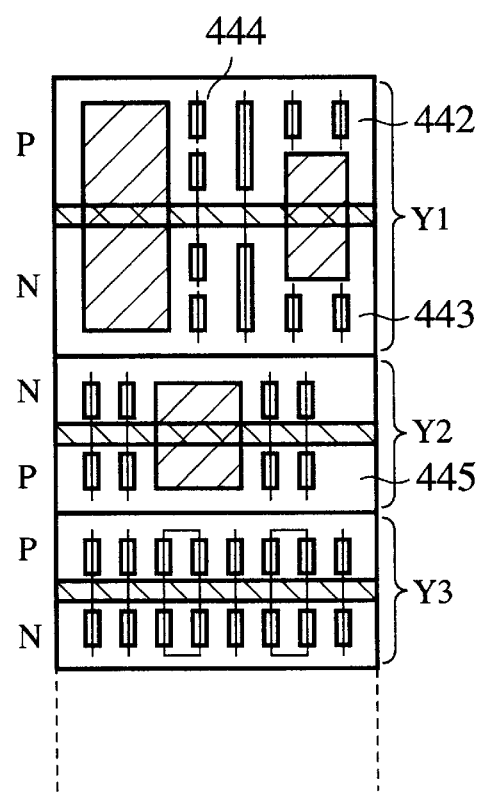

With the above procedures, heights of the second and third rows in FIG. 10A, i.e., heights of P-well region and N-well region may be reduced to heights of the second and third rows in FIG. 10B.

Next, the case will be explained wherein the number of rows and module height MH are given beforehand and then module width is suitably reduced as described earlier. The same procedure as in the foregoing example will be taken until step 2.

In step 2, an initial row width IRW and row width allowance ARW are determined by the given number of rows NR. Assume that TL is a length of transistor; DT, distance between transistors; NT, total number of transistors; TWi (i=1 to NT), width of respective transistors; NC, total number of cells; and CWi (i=1 to NC), width of respective cells, then the initial row width IRW is given by $$IRW = NT/2 * (TL + DT)/NR + \sum^{NC} CWi/NR, \quad (6)$$

The row width allowance ARW is then given as α% of the initial row width IRW, i.e., $$ARW = IRW * \alpha/100. \quad (7)$$

Like the foregoing description, the transistors and the cells are arranged in the range of row width allowance (step 3).

In step 4, a module width, i.e., row width RW is decided. Here a module height has been given. Presumptive heights of respective rows are assumed as $$IRHr = max(CHri, minTW). \quad (8)$$

As in the equation (3) or (5), respective row widths are calculated similarly according to the presumptive heights IRHr. As far as $$\sum^{RN} IRHr < MH, \quad (9)$$

is satisfied, it would be repeated that the presumptive height of the row having the largest width is incremented by minTW. Finally, a row width is assumed as RW when $$\sum^{RN} IRHr = MH, \quad (10)$$

is achieved. Under this row width RW, processes succeeding to step 5 will be implemented as stated above.

Next, the case will be explained where a height of the row is reduced by stacking the transistors having the same polarity on the upper and lower portions of the cells. Up to step 3, the same processes as in the above examples are executed.

In the event that the transistors having the same polarity are stacked on the upper and lower portions of the cells, a height RHr of the row r is given by $$min(CHri, minTW) <= RH <= max(TWri, CHri), \quad (11)$$

where $$RHr = max(TWri, CHri). \quad (12)$$

First, for respective cells having the heights of RHr>CHri, the largest transistor is allocated sequentially according to TWri which satisfies $$CHri + TWri < Rhr \quad (13)$$

in the order of larger CHri. After transistors have been allocated in all cells, combinations of remaining transistors which satisfies $$TWri + TWrJ < RH \quad (14)$$

are made in the order of larger size. Like this, if entire combinations are made, the row widths RWr can be obtained according to the row height RHr. Assume that widths of the transistors which have been stacked on the upper and lower portions of the cells or other transistors are TSWJ (j=1 to NTSr), row widths can be reduced by occupied area of these transistors according to the row width calculated by the equation (3). In other words, the row widths RWr $$RWr = \sum^{NTr} I\{(TWri + RHr - minTW)/RHr\} * (TL + DT) + \quad (15)$$

$$\sum^{NTCr} CWri - \sum^{NTCr} I\{(TWrj + RHr - minTW)/RHr\} * (TL + DT),$$

can be achieved. Otherwise, if the equation (5) may be applied, the row widths Rwr $$RWr = \sum^{NTr} I\{(TWri + max(CHri) - minTw)/max(CHri)\} * \quad (16)$$

$$(TL + DT) + \sum^{NTCr} CWri -$$

$$\sum^{NTSr} I\{(TWrj + max(CHri) - minTW)/max(CHri)\} * (TL + DT),$$

can be attained.

Following processes are similar to those in the above examples except that the transistors are stacked up to the height decided in step 6. According to such stacking process of the transistors, the width of the first row in FIG. 10A may be reduced to that of the first row in FIG. 10B. More particularly, P-channel transistors 442 are piled up on P-channel region side of the cell 411 and N-channel transistors 443 are piled up on N-channel region side, and a pair of transistors 444 are stacked respectively on both the P-channel region side and the N-channel region side in the vertical direction. Consequently, widths of the P-well region and the N-well region required for the transistors and the cells may be reduced.

In the examples in FIGS. 10A and 10B, the cells having different heights have been employed. Usually heights of the cells are unified in the cell library, and it is not so much executed to combine libraries having different heights because layout efficiency is decreased. However, in the event of the present invention, since layout efficiency is never decreased even if the libraries having different heights are utilized, margin in the design may be improved.

Fifth Embodiment

A fifth embodiment of the present invention will be explained with reference to FIGS. 12 and 13.

Figure 12A:
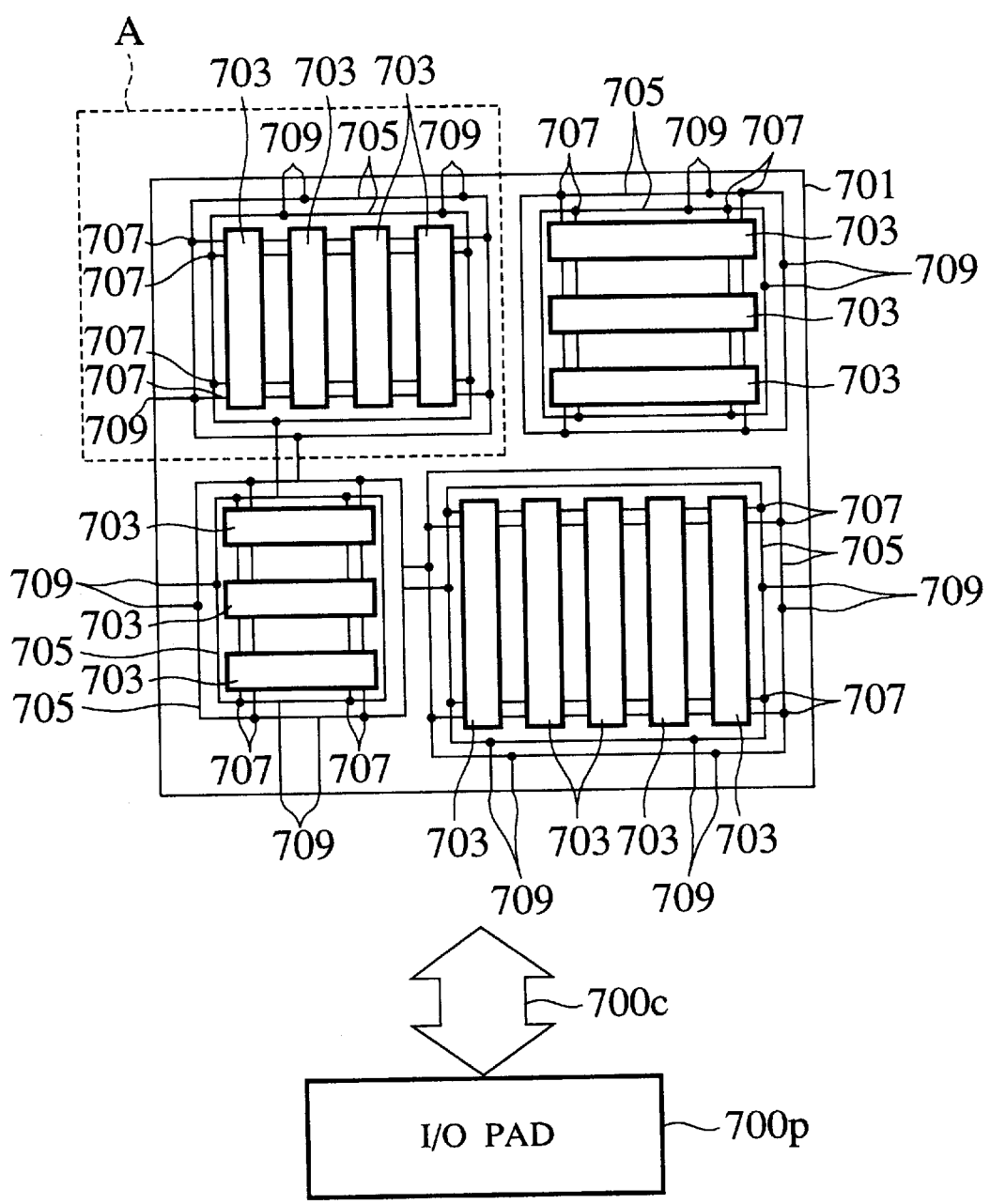
FIG. 12A is a schematic circuit diagram showing an embodiment of a semiconductor integrated circuit according to a fifth embodiment of the present invention.
Figure 13:
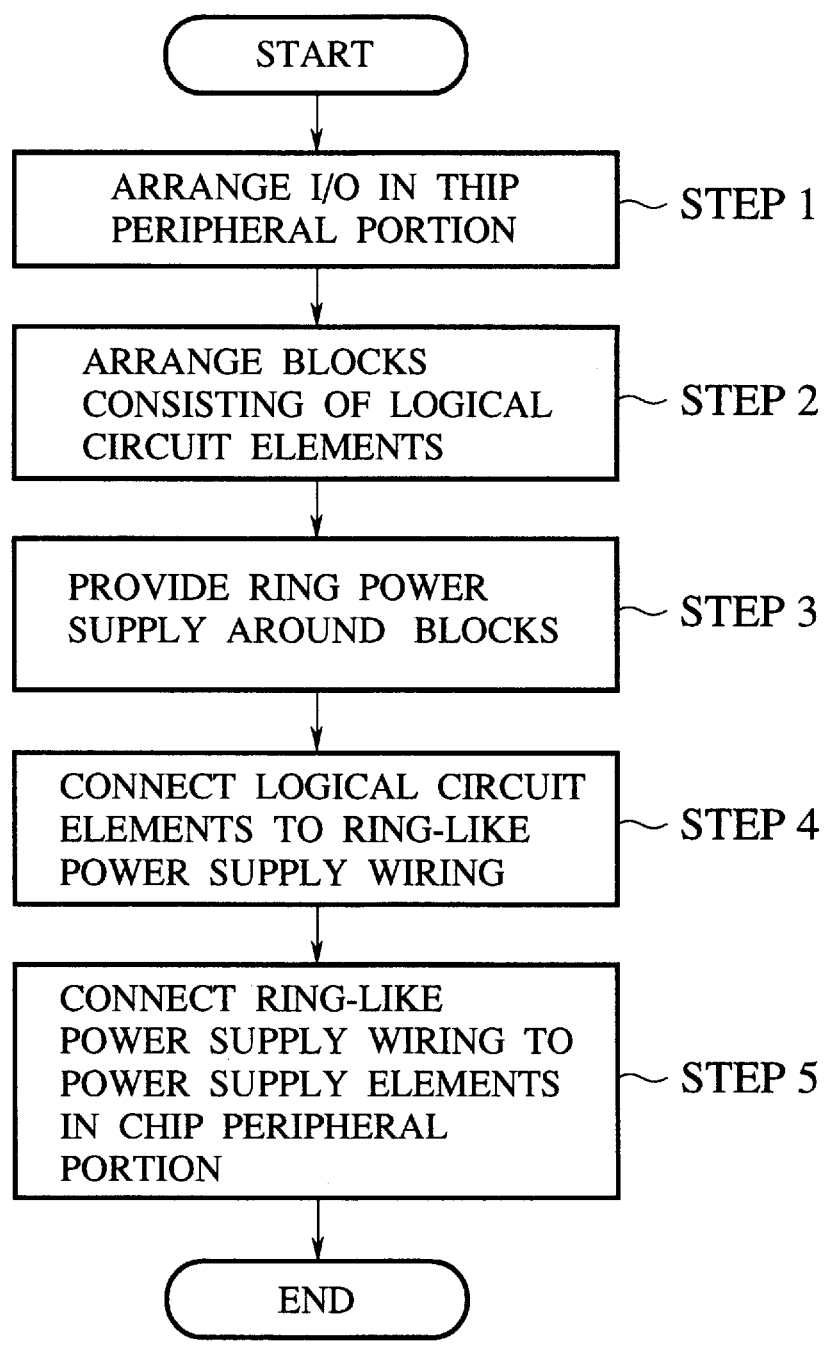
FIG. 13 is a flowchart illustrating process according to the fifth embodiment of the present invention.

FIG. 12A is a schematic circuit diagram showing an embodiment wherein the present invention is applied to the standard cell LSI. FIG. 13 is a flowchart illustrating process according to the fifth embodiment of the present invention. Along steps in the flowchart in FIG. 13, processes according to the fifth embodiment will be explained with reference to FIG. 12A. The fifth embodiment will be explained by way of the hierarchy layout scheme.

First I/O pads 700p are arranged on the peripheral portion of the chip. Although they are shown simply by symbols in FIG. 12A, they are in fact arranged around the chip. A rectangular 701 denotes an inside of these I/O portions (step 1).

Then element rows 703 comprising a plurality of logical circuit elements are formed together in every block. All blocks are arranged on the chip (step 2).

In turn, the quantity of current necessary for the block is calculated on the basis of the quantity of current required for operation of respective logical circuit elements. Line widths of the power supply wirings are then determined so as to fit for the quantity of current. Ring-like power supply wirings 705 having the line widths determined in the above way are laid around respective blocks like a ring (step 3). The ring power supply wirings 705 will be explained in detail later.

Power-supply wire dedicated elements arranged in the element rows 703 and the ring power supply wirings 705 are connected by wirings 707 electrically. In case the chip is formed as a multilayered wiring structure and in addition power supply terminals for the power-supply line dedicated elements are formed differently from wiring layers of the ring power supply wirings 705, the wirings 707 are connected by virtue of VIAs (step 4).

Figure 12B:
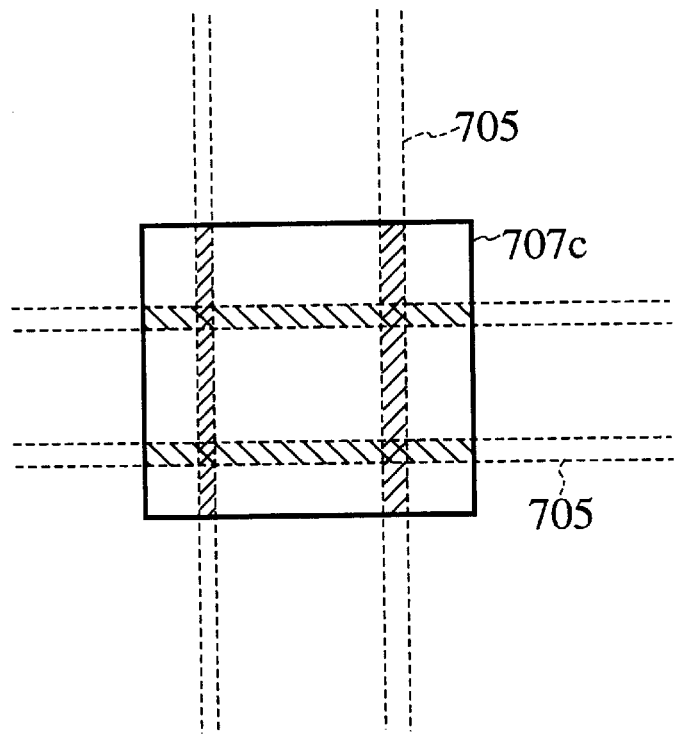
FIG. 12B is a schematic circuit diagram showing a power-supply line dedicated element of the semiconductor integrated circuit according to the fifth embodiment of the present invention.
Figure 12C:
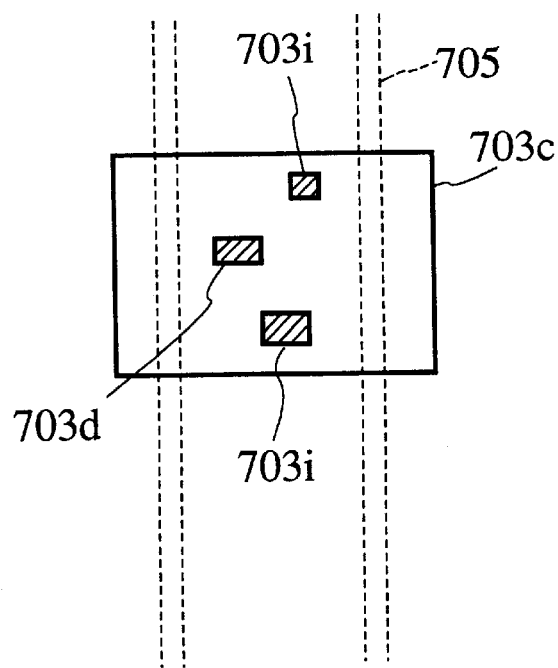
FIG. 12C is a schematic circuit diagram showing a normal cell of the semiconductor integrated circuit according to the fifth embodiment of the present invention.

The power-supply wire dedicated elements are exceptional cells 707c which are composed only of power-supply wires as illustrated in FIG. 12B. Contrary to this, normal cells 703c are usually composed of logical devices 703d, input/output terminals 703i and so on as illustrated in FIG. 12C.

Finally, while avoiding bending portions of wirings as much as possible, the ring power supply wirings 705 and the power supply elements located on the peripheral portion of the chip are connected by wirings 709 electrically. As shown in FIG. 12A, the wirings 709 may be arranged without their bending portions by providing the ring power supply wirings 705. As a result, an occupied area of the power supply wirings may be reduced (step 5). Of course, step 5 can be conducted in advance of step 4 without modification.

Subsequently, the ring power supply wirings 705 shown in FIG. 12A will be explained with reference to FIG. 14.

Figure 14:
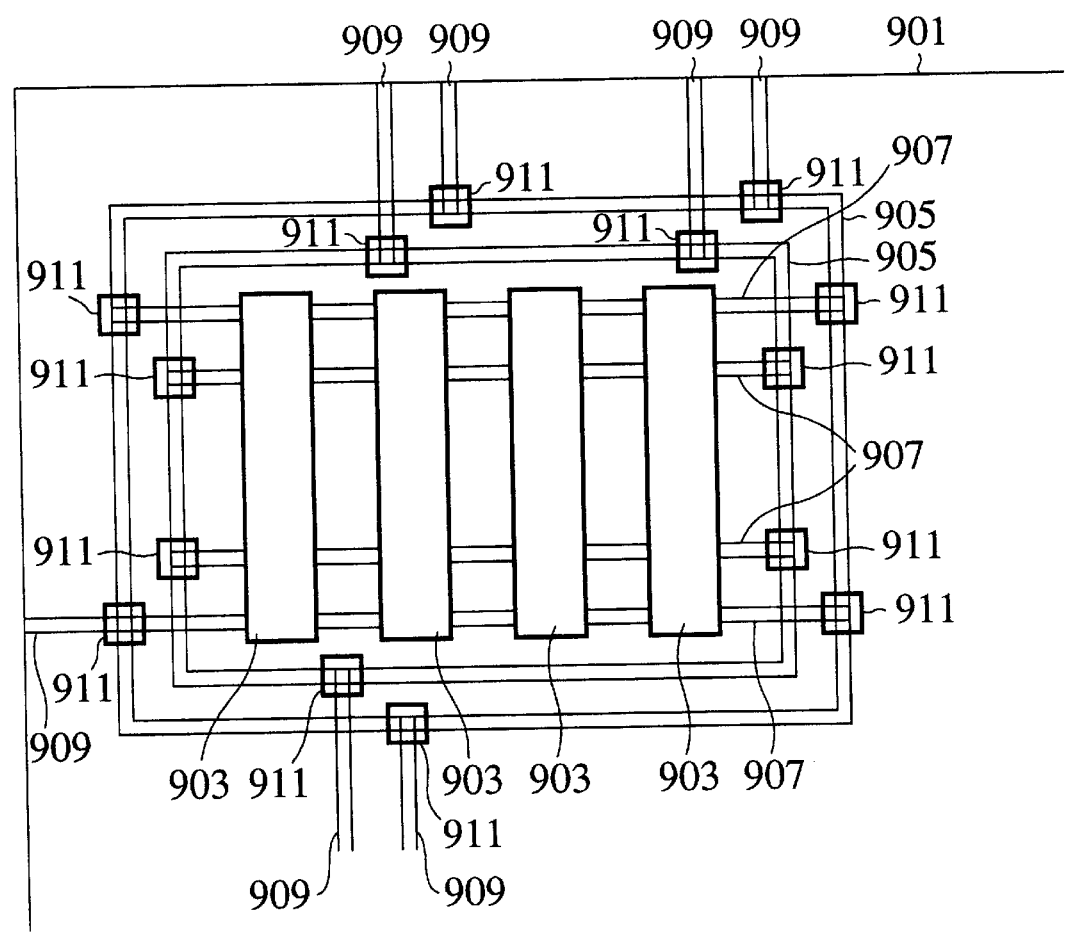
FIG. 14 is a schematic circuit diagram showing part of the example of the semiconductor integrated circuit shown in FIG. 12A to explain the fifth embodiment of the present invention.

FIG. 14 is an enlarged view of A portion in FIG. 12A, wherein ring power supply wirings 905 are formed around the blocks composed of four element rows 903, each consisting of a plurality of logical circuit elements. Since two power supplies are needed usually to operate the logical circuits, the ring power supply wirings 905 are formed by power supply wires and ground wires respectively. In the fifth embodiment, a positional relation between this power supply line and this ground line is set arbitrarily.

The ring power supply wirings 905 are connected to the element rows 903 electrically via the wirings 907 and the VIAs 911. The ring power supply wirings 905 are connected to the power supply elements around the chip periphery and the ring power supply wirings provided in adjacent block via the wirings 909 and the VIAs 911. Because the power supply wirings are formed in a ring fashion, the wirings 907 can be connected to the element rows 903 and simultaneously the wirings 909 can be connected to the power supply elements on the chip periphery or the ring power supply wirings provided in adjacent block by the shortest distance from the ring power supply wirings 905. As a result, resultant short length of the power supply wiring enables the area of the wiring regions to be reduced, and in addition it is effective to reduce wiring impedance and reduce power supply noises.

In the following, several examples of the wiring layers such as the ring power supply wirings will be explained particularly. In FIGS. 15 to 19, the element rows composed of the logical circuit elements and the wirings for connecting the element rows with the ring power supply wirings are omitted.

Figure 15:
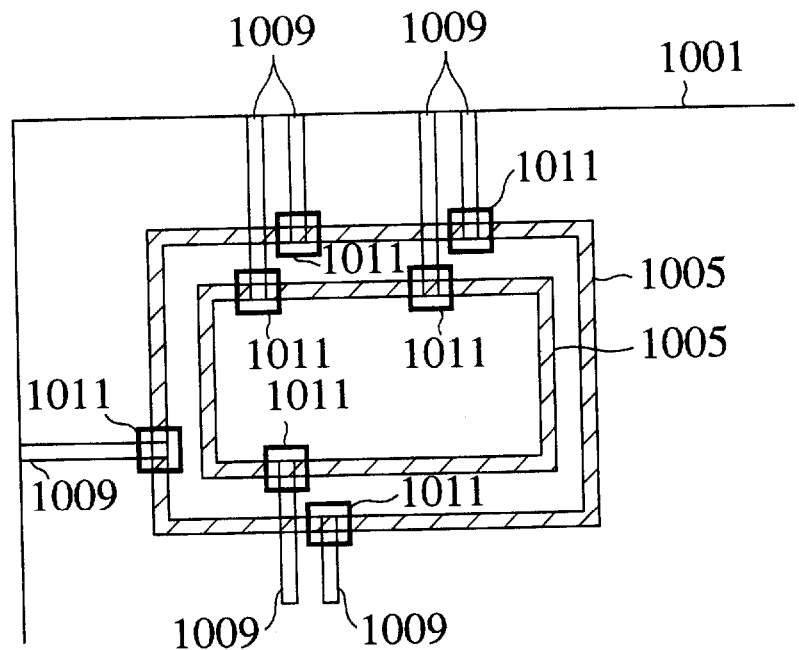
FIG. 15 is a schematic circuit diagram showing an example of ring power supply wirings in the semiconductor integrated circuit according to the fifth embodiment of the present invention.

In the example in FIG. 15, two ring power supply wirings are formed by the same wiring layer. Since respective ring power supply wirings are formed by the same layer, no VIA is needed on the bending portions of the wirings. More particularly, there is no need that large size VIAs for exclusive use in power supply wirings which have wide line widths rather than those of common signal lines must be provided on the bending portions of the ring-like power supply wirings 1005. For this reason, the occupied area of the ring power supply wirings may be lessened in that respect.

Figure 16:
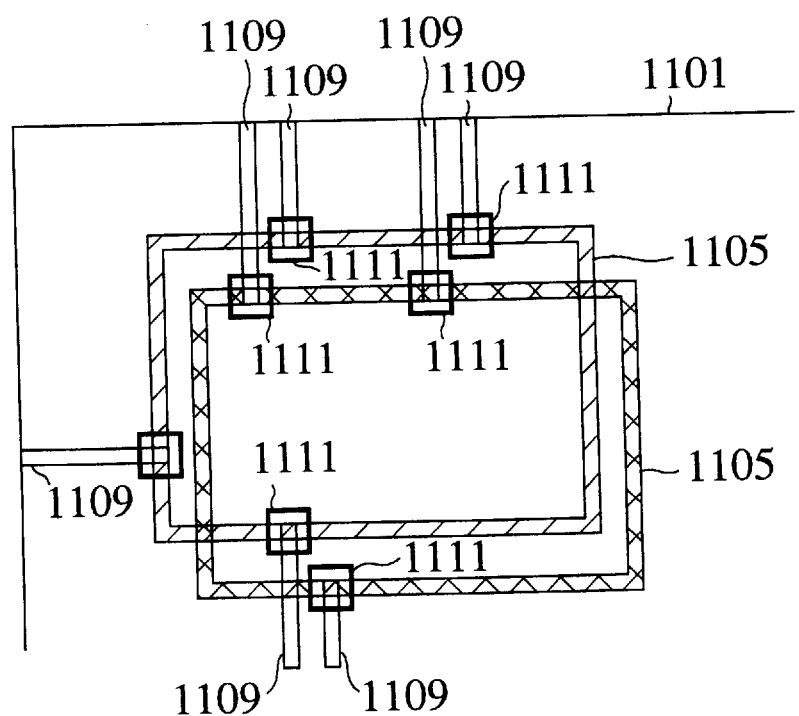
FIG. 16 is a schematic circuit diagram showing another example of ring power supply wirings in the semiconductor integrated circuit according to the fifth embodiment of the present invention.

In the example in FIG. 16, two ring power supply wirings 1105 are formed by separate wiring layers. VIAs are not needed on the bending portions of the ring power supply wirings 1105. In addition, if ring power supply wirings connected to the lower ring power supply wiring 1105 and the lower ring power supply wiring 1105 are formed in the same layer, these power supply wirings may be formed as a two-layered structure.

Figure 17:
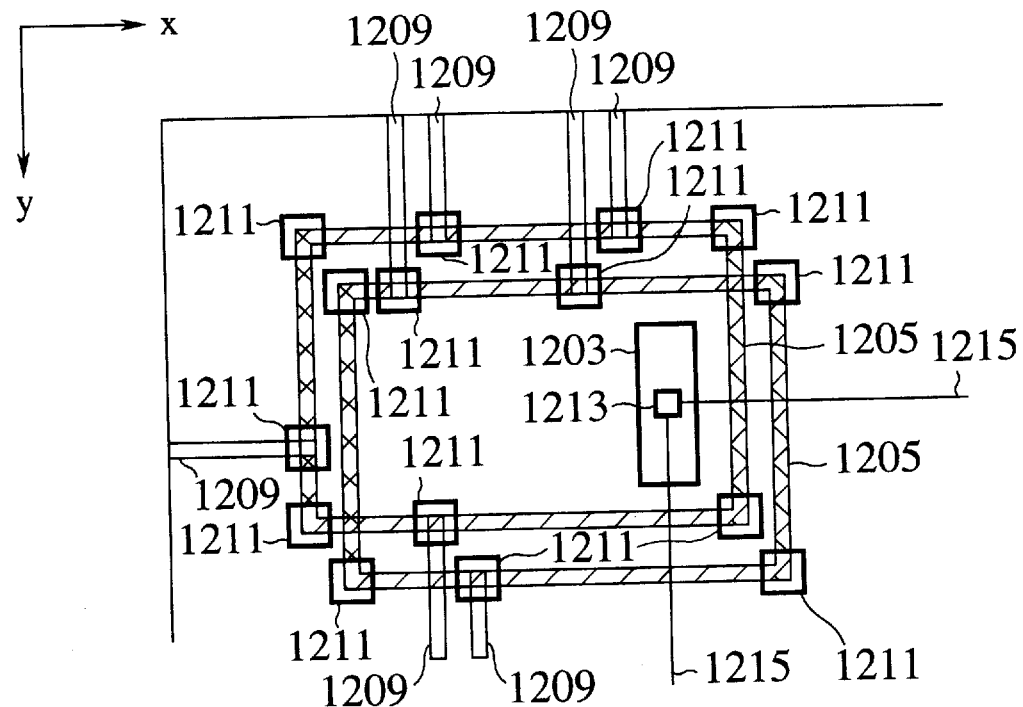
FIG. 17 is a schematic circuit diagram showing a still another example of ring power supply wirings in the semiconductor integrated circuit according to the fifth embodiment of the present invention.

In the example in FIG. 17, a ring power supply wiring 1205 is formed by a two-layered wiring layer. In other words, a wiring in the x direction and a wiring in the y direction are formed respectively with different wiring layers. In this example, VIAs 1211 must be formed on the bending points of respective ring power supply wirings 1205 to connect the wiring in the x direction and the wiring in the y direction. But if the x and y direction wirings of common signal wires 1215 and the x and y direction wirings of the ring power supply wiring 1205 are formed in the same layer, the common signal lines 1215 can be connected to the logical circuit elements 1213 in the element rows 1203 perpendicularly to the ring power supply wirings 1205, as shown in FIG. 17. Hence, the wiring layer used exclusively as the common signal wires 1215 may be omitted. For this reason, the number of wiring layers in the chip may be reduced and therefore cost of the chip may be lowered. In this example, a ring power supply wiring 1205 has been formed by the two-layered wiring layer, but the same advantage can be achieved if the ring power supply wiring 1205 is formed by at least two layers.

Figure 18:
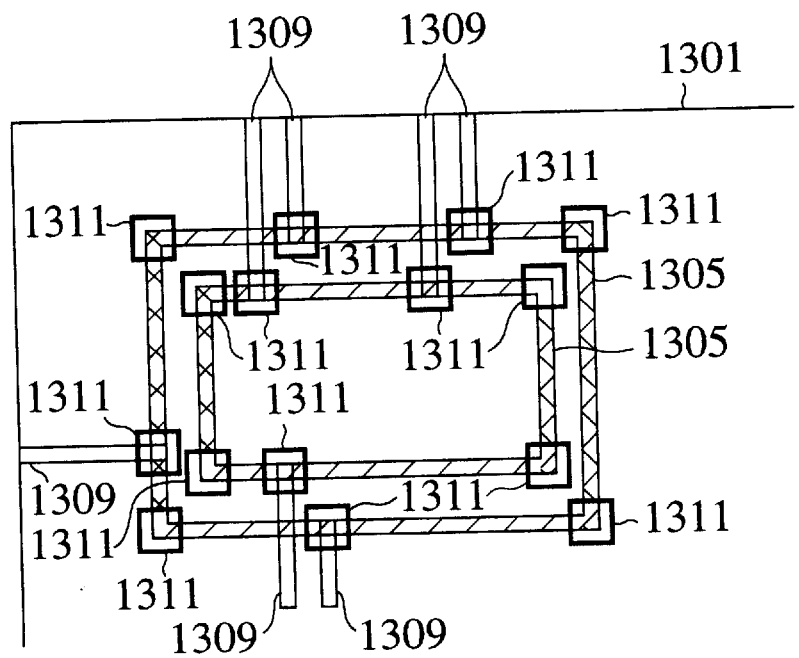
FIG. 18 is a schematic circuit diagram showing a yet still another example of ring power supply wirings in the semiconductor integrated circuit according to the fifth embodiment of the present invention.
Figure 19:
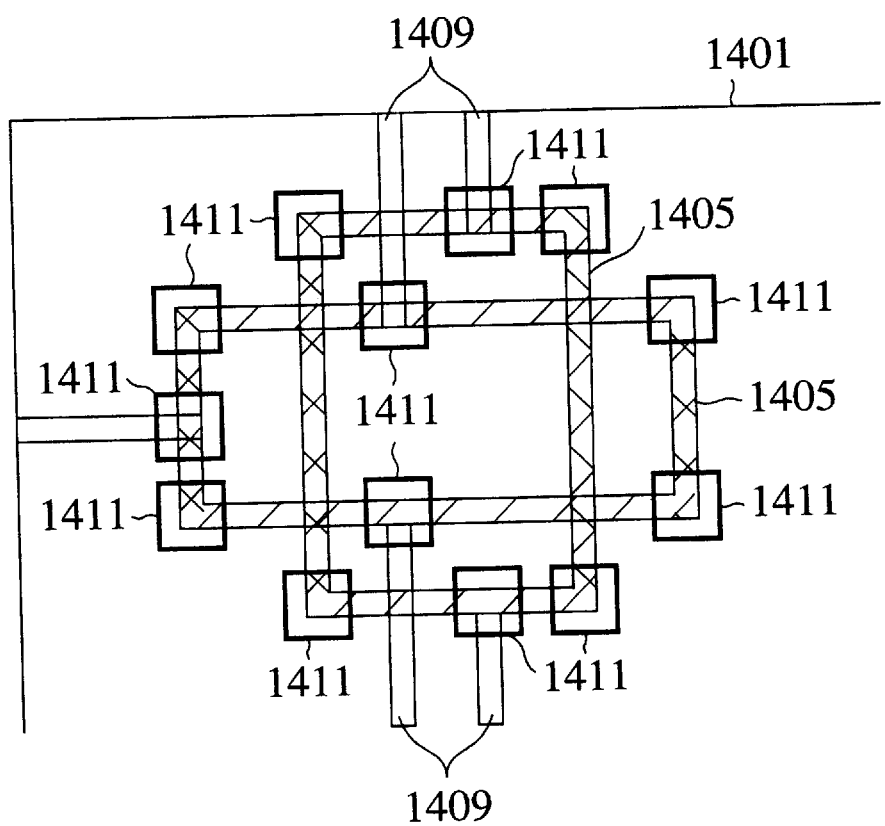
FIG. 19 is a schematic circuit diagram showing a further example of ring power supply wirings in the semiconductor integrated circuit according to the fifth embodiment of the present invention.

Examples shown in FIGS. 18 and 19 are another examples in which, like the embodiment shown in FIG. 17, a ring power supply wiring is formed by wiring layers formed of at least two layers.

Next, the case will be explained with reference to FIG. 15 where the present invention has been applied to the block consisting of the same logical circuit elements as those in the conventional example shown in FIG. 2. The layout will be designed according to a like design rule in the conventional example.

Figure 1:
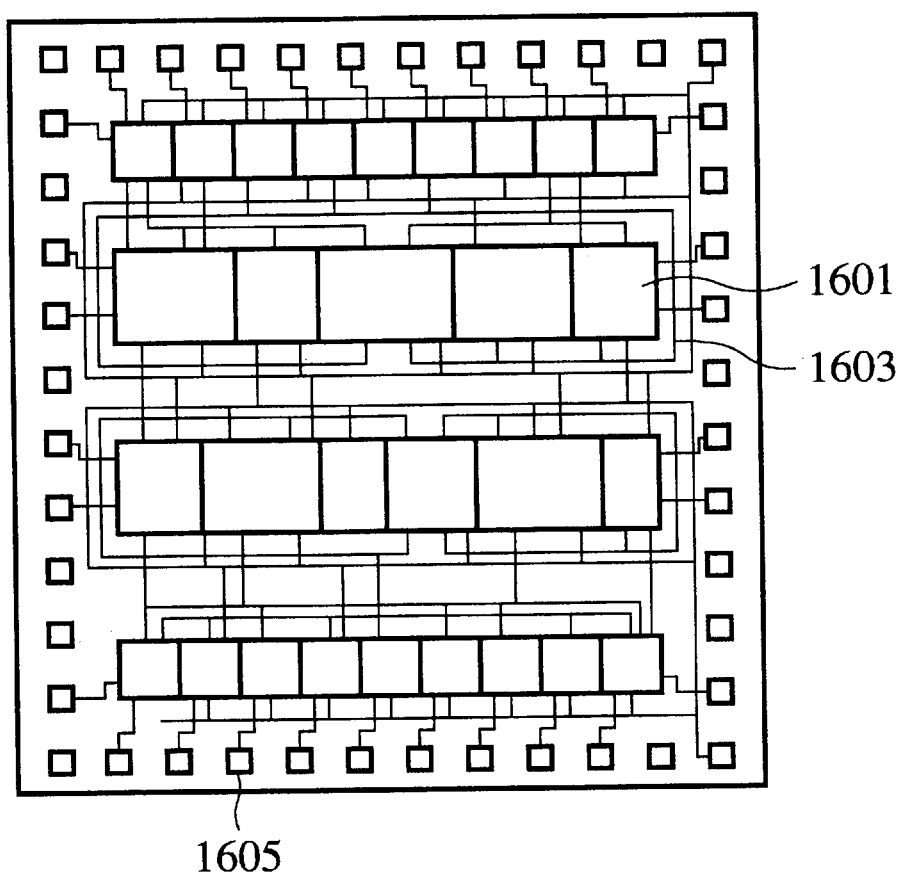
FIG. 1 is a schematic plan view showing an example of the conventional layout of the semiconductor integrated circuit.
Figure 2:
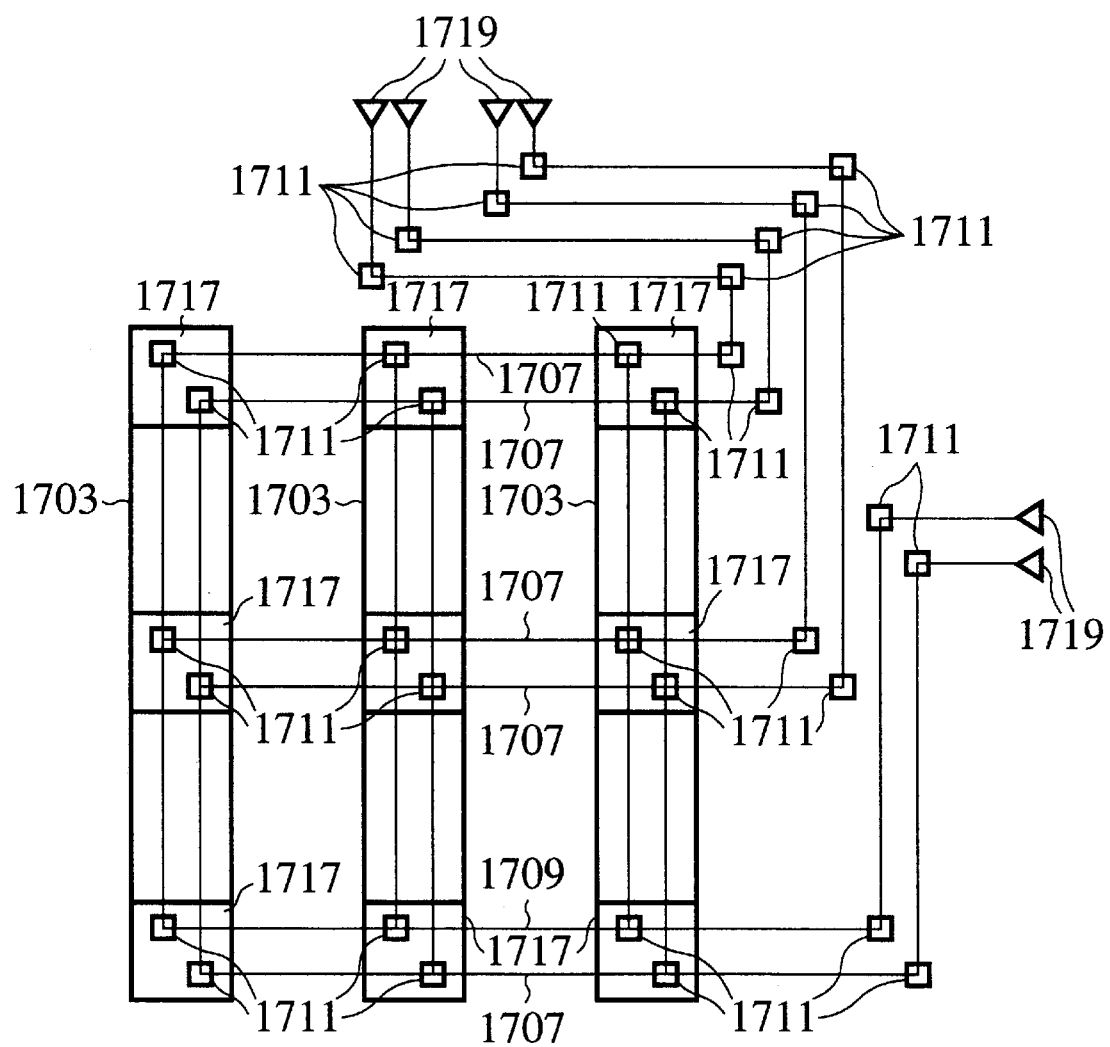
FIG. 2 is a schematic plan view showing an example of the conventional power supply wirings.
Figure 20:
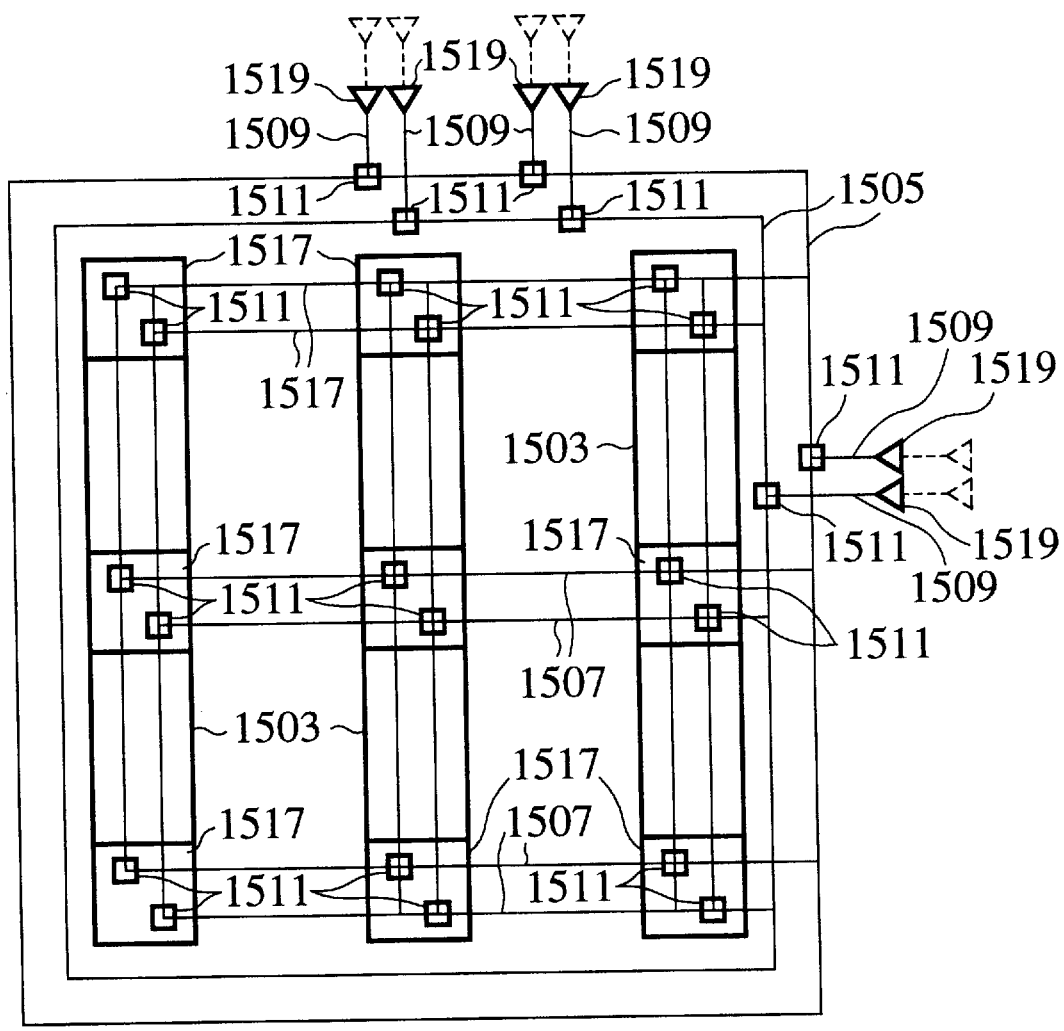
FIG. 20 is a schematic plan view showing an example of power supply wirings laid by the process shown in the flowchart in FIG. 13.

FIG. 20 is a schematic plan view showing an example wherein power supply wirings are laid in the block consisting of elements rows formed by the same logical circuit elements as those in the conventional example shown in FIG. 2 according to the fifth embodiment of the present invention.

Referring to FIG. 20, power supply line dedicated elements 1517 for connecting electrically power supplies between the element rows are provided on both sides and in the middle of an element row 1503 which is composed of a plurality of logical circuit elements. Ring power supply wirings 1505 are formed around the block composed of the element rows 1503. The power supply line dedicated elements 1517 and the ring power supply wirings 1505 are connected by wirings 1507. With considering the VIAs 1511 and the wiring design rule, wirings 1509 are also formed to connect the ring power supply wirings 1505 with power supply elements 1519.

It can be seen by comparing FIG. 20 with FIG. 2 that the power supply elements 1519 in FIG. 20 are positioned in the inner side of the chip rather than those in FIG. 2. Therefore, the fifth embodiment can contribute effectively to reduction of the chip area.

Sixth Embodiment

An sixth embodiment of the present invention to which the fifth embodiment of the present invention is applied will be explained hereinafter.

In the sixth embodiment, magnitudes of the voltage supplied from the power supply elements to respective blocks may be set block by block. In other words, by changing voltages supplied from the power supply elements, suitable voltage may be supplied to the circuit composed of the block which being formed of element rows 903 shown in FIG. 14 via wiring 909, ring power supply wiring 905, and wiring 907.

Figure 21:
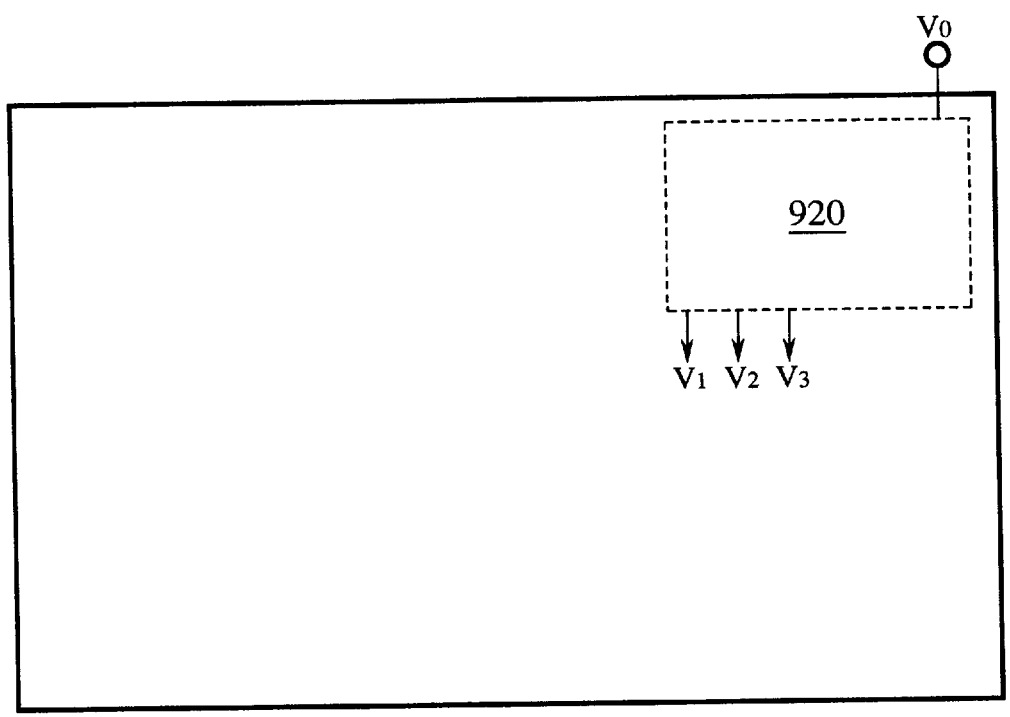
FIG. 21 is a view showing an embodiment to which the fifth embodiment of the present invention is applied.

More particularly, as shown in FIG. 21, a converter 920 having a plurality of output voltage levels is provided on the chip. Here external voltages Vo are converted into respective voltage levels V1, V2, V3, etc. so as to be supplied to respective blocks.

With the above process, different voltage may be supplied to every block in the chip. Accordingly, in the event that operation of the circuit may be kept by the lower voltage than the voltage being supplied to the chip, extra power consumption in the circuit may be reduced by setting the voltage on the power supply terminal to a minimum voltage required for the operation of the circuit.

As described above, power consumption in the logical circuit portions may be lessened in comparison with the case where a constant voltage is supplied to the entire blocks.

According to the present invention, as has been discussed earlier, since sizes of the transistors can be optimized in the transistor level layout, optimal layout patterns may be generated. Since the cell patterns being optimally designed beforehand relative to particular gates can be employed, the gates which cannot be optimally designed at the transistor level may be implemented in the smallest size. Thus by designing the layout including mixedly the gate level and the transistor level, the smallest layout patterns together with reduction of power consumption may be readily achieved.

In addition, according to the present invention, since the ring power supply wiring has been laid around the block consisting of the logical circuit elements, the power supply wirings having broad wire widths rather than common signal wires may be connected without their bending portions. As a result, the wiring length of the power supply wiring may be lessened, which leads to reduction of the occupied area of the power supply wirings. This also makes it possible to reduce the chip area. Further, since wiring impedance may be decreased because of reduction of the wiring length of the power supply wiring, reduction of the power supply noise may be effectively implemented. Furthermore, since the power supply voltage of different magnitude can be supplied to respective blocks, reduction of the power consumption may be effectively carried out.

In addition, according to the present invention, even in the event that sizes of the cell and the transistors are different and initial row widths are also different, dead spaces in both height and width directions may be eliminated by parallelization and stacking of the transistors. As a result, desired patterns may be obtained in the smallest area.

The foregoing description of preferred embodiments has been presented for purposes of illustration and description. It is not intended to be exhaustive to or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A method for designing a semiconductor integrated circuit comprising the steps of:

generating a gate level connection description describing a plurality of gates;

replacing at least one of said plurality of gates with cells from a cell library, wherein said cell library is prepared in advance;

replacing others of said plurality of gates with transistor level connections; and designing a layout to be used in said semiconductor integrated circuit comprising said cells and said transistor level connections.

2. The method for designing a semiconductor integrated circuit as claimed in claim 1, wherein information for designating which of said ones of said plurality of gates to be replaced by said cells, is prepared in advance.

3. The method for designing a semiconductor integrated circuit as claimed in claim 1, wherein said transistor level connections comprise transistors arranged to form N-channel and P-channel transistors, said N-channel and P-channel are designed and located freely in said layout.

* * * * *